United States Patent [19]

Ono et al.

[11] Patent Number: 4,988,956

[45] Date of Patent: Jan. 29, 1991

[54] AUTO-RESONANT PENIOTRON HAVING AMPLIFYING WAVEGUIDE SECTION

[75] Inventors: Shoichi Ono; Kuniyoshi Yokoo, both of Sendai; Tadashi Okamoto, Yokohama, all of Japan

[73] Assignee: Kabushiki Kaisha Toshiba, Japan

[21] Appl. No.: 427,473

[22] Filed: Oct. 27, 1989

[30] Foreign Application Priority Data

Oct. 31, 1988 [JP] Japan ................................ 63-272941

[51] Int. Cl.[5] .......................... H03B 9/08; H01J 25/44

[52] U.S. Cl. ...................................... 331/86; 315/5.35; 315/39.3; 331/82

[58] Field of Search ........................ 331/79, 81, 82, 86; 315/5, 5.29, 5.31, 5.35, 39, 39.3

[56] References Cited

U.S. PATENT DOCUMENTS 4,395,655 7/1983 Warthman ........................ 331/79 X

FOREIGN PATENT DOCUMENTS 4535334 11/1970 Japan .
6037 1/1985 Japan .
61-273833 12/1986 Japan .

OTHER PUBLICATIONS

Yokoo et al., "Auto-Resonant Peniotron for High Power Millimeter Wave Generation with an Extremely High Efficiency", SPIE, Conference Digest, Thirteenth International Conference on Infrared and Millimeter Waves, Dec. 5-9, 1988, Honolulu, Hawaii, pp. iii, xiii, 137, 138.

J. Baird, L. Barnett et al., "Harmonic Auto-Resonant Peniotron (HARP) Interactions", IEEE IEDM, Dec., 1987, 87-913 to 916.

Shoichi Ono, Kunio Tsutki and Takao Kageyama, "Proposing the Gyro-Peniotron, with . . . ", IEEE IEDM, Dec., 1983, 456-459.

*Primary Examiner*—Siegfried H. Grimm
*Attorney, Agent, or Firm*—Cushman, Darby & Cushman

[57] ABSTRACT

In a peniotron, a hollow electron beam is generated from a cathode gun assembly and a DC magnetic field is applied to the electron beam from solenoid coils. Thus, each electron of the electron beam is gyrated into a resonant cavity and into propagating waveguide sections which are maintained in auto-resonant conditions so that the electrons interact with an electromagnetic waves of TE mode not only in the resonant cavity section but also in a waveguide section. Accordingly, the electromagnetic wave is oscillated in the resonant waveguide section and amplified in the propagating waveguide section in such a manner that the level of the electromagnetic wave in the resonant cavity section is far less than the output power from said propagating waveguide.

4 Claims, 5 Drawing Sheets

AUTO-RESONANT PENIOTRON HAVING AMPLIFYING WAVEGUIDE SECTION

BACKGROUND OF THE INVENTION

1. Field of the Invention

The present invention relates to an extremely high frequency oscillator and, more particularly to an extremely high frequency oscillator having a high frequency circuit assembly comprising a resonant cavity and a waveguide, wherein each electron gyrating within a DC magnetic field interacts with TE-mode electromagnetic waves propagating within the high frequency circuit assembly, thereby to oscillate electromagnetic waves having wavelengths in the order of millimeters to submillimeters.

2. Description of the Related Art

One of the known electron tubes of this type is a peniotron. As is disclosed in Japanese Patent Publication No. 45-35334 and Japanese Patent Disclosure No. 61-273833, a peniotron is a high power electron tube which comprises a high frequency circuit assembly and oscillates or amplifies electromagnetic waves by virtue of the phase-separation effect resulting from the interaction between electrons gyrating within a DC magnetic field and the electromagnetic waves propagating within the circuit assembly.

The peniotron utilizes the effect resulting from the movements of guiding centers around which electrons gyrate in a spatially non-uniform, high frequency electromagnetic field. Each electron is alternately accelerated and decelerated every time it gyrates around the guiding center. The accelerations and decelerations of each electron are gradually accumulated. In this interaction, the successive deceleration is stronger than the previous acceleration. A kinetic energy of each electron corresponding to accumulated deceleration is converted into the high frequency electromagnetic energy. The essential feature of the operating mechanism of the peniotron is the energy exchange between the individual electrons and the high frequency electromagnetic field. The operating mechanism of the peniotron is basically different from that of the klystron or the gyrotron in which the electromagnetic field is amplified or oscillated because a bunching of electrons interacts with the electromagnetic field. Hence, the peniotron can perform an operation wherein electrons act, independent of a phase relationship between the electrons and the high frequency electromagnetic field. All of the electrons are therefore trapped within the deceleration electric field of the electromagnetic waves due to the phase-separation effect. In theory, all gyrating kinetic energy of the electrons can be converted into the energy of the electromagnetic waves. In view of this, the efficiency of the energy conversion, from the electrons to the electromagnetic waves, can be expected to be extremely high.

The conventional oscillator, described above cannot convert the kinetic energy acting in the longitudinal direction of the tube into the energy of electromagnetic waves. It is impossible with the prior-art oscillator to increase the energy-conversion efficiency to a near-100% value, unless the oscillator is equipped with a perfect depressed collector. Another problem with the conventional oscillator is that the higher the frequency of the electromagnetic waves, the smaller the resonant cavity and waveguide of the high frequency circuit assembly should be. The smaller the resonant cavity and the waveguide, the lower the electric power capacity, because a permissible electric power loss of the circuit is restricted. Further, the oscillator requires an intense DC magnetic field, and the frequency of the electromagnetic waves is limited. The oscillators, developed thus far, can output 10 kW at an operating frequency of 45 GHz at best.

SUMMARY OF THE INVENTION

Accordingly, it is the object of this invention to provide a high-power, extremely high frequency oscillator which satisfies auto-resonant conditions required for oscillating high frequency electromagnetic wave. Another object of the present invention is to provide such an oscillator which has an energy-conversion efficiency as high as a theoretical energy-conversion efficiency of the peniotron, and which can oscillate electromagnetic waves having wavelengths in the order of millimeters to sub-millimeters.

According to the present invention, there is provided an extremely high frequency oscillator, in which each of gyrating electrons, i.e., circulating and traveling electrons, and TE-mode electromagnetic waves interact within a high frequency circuit assembly, satisfying auto-resonant conditions when the phase velocity Vp of the waves is equal to, or nearly equal to, the light velocity c. The high frequency circuit assembly comprises a resonant cavity and a propagating waveguide connected to the downstream-end of the cavity. The high frequency power being oscillated in the cavity is sufficiently suppressed to a value less than that of the high frequency power being output from the waveguide. The extremely high frequency oscillator of this invention is named as an auto-resonant peniotron in this specification.

The oscillator performs a preliminary, low-power oscillation within the auto-resonant cavity. More specifically, electrons interact in the cavity to a relatively low degree, with a TE-mode electromagnetic field propagating along the beam. Accordingly, reflection electromagnetic waves produced in the cavity do not affect the auto-resonant conditions so that the auto-resonant conditions are always maintained The behavior variations of the electrons are suppressed. The oscillating power level in the cavity can be set by selecting Q value of the cavity A beam of the electrons passing through the cavity and the electromagnetic waves are merged in the propagating waveguide. In the waveguide, the beam and the wave interact while maintaining the auto-resonant conditions. Therefore, not only the circulating kinetic energy of the electrons, but also the traveling kinetic energy of the electrons serve to intensify the electromagnetic field within the propagating waveguide. Hence, the oscillator has a high energy-conversion efficiency.

DETAILED DESCRIPTION OF THE PREFERRED EMBODIMENTS

An embodiment of the invention will now be described in detail, with reference to the accompanying drawings.

Figure 1:
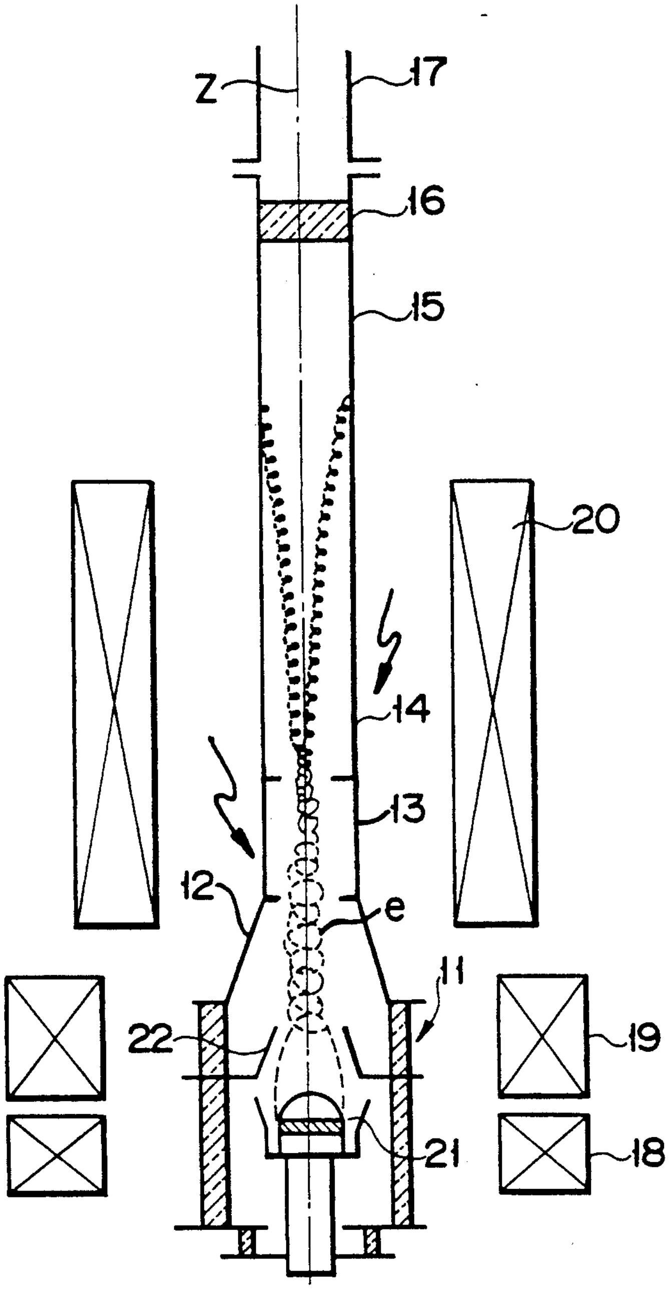
FIG. 1 is a schematic representation of a peniotron according to the present invention.

FIG. 1 schematically illustrates a peniotron, which is an embodiment of the present invention As is shown in FIG. 1, the peniotron comprises an electron gun assembly 11, a beam-guiding section 12 coupled to the gun assembly 11, and a resonant cavity section 13 connected to the beam-guiding section 12. The electron gun assembly 11 extends in the axis z of the peniotron. The beam-guiding section 12 guides the electron beam emitted from the assembly 11 into the resonant cavity section 13.

The peniotron further comprises a propagating wave guide 14 connected to the downstream end of the section 13, a collector section 15 coupled to the output end of the waveguide 14, and an output waveguide 17 coupled to the output end of the collector 15. The propagating waveguide 14 has the same cross section as the resonant cavity section 13 and the collector section 15 is designed to collect electrons. A window 16, which is a dielectric member, is located within the junction between the collector section 15 and the output waveguide 17, and attached in airtight fashion to the inner surface of the junction The peniotron further comprises three solenoid coil units 18, 19, and 20. The coil units 18 and 19 surround the electron gun assembly 11. The coil unit 20 surrounds both the resonance cavity section 13 and the propagating waveguide 14.

The electron gun assembly 11 has a cathode 21 and an accelerating anode 22. The cathode 21 emits electrons from its circumferential region when it is heated The anode 22 accelerates the electrons emitted from the cathode 21. As a result, the electron gun assembly 11 emits a hollow electron beam e. The solenoid coil units 18 and 19, both surrounding the electron gun assembly 11, generate DC magnetic fields having predetermined intensities. Due to these DC magnetic fields, each electron of the hollow electron beam e is gyrated. The solenoid coil unit 20 generates a DC magnetic field having a predetermined intensity and extending almost parallel to the axis z of the peniotron, which causes the electrons of the electron beam e to gyrate at predetermined cycles. The resonant cavity section 13 and the propagating waveguide 14 have inner diameters far greater than the wave length of the electromagnetic waves oscillated in the peniotron. This enables the electromagnetic waves of a predetermined mode to propagate through the waveguide 14 at a phase velocity Vp which is nearly equal to light velocity c. As a result, the interior of the cavity and waveguide remains under auto-resonant conditions. The electromagnetic waves oscillated in the peniotron shown in FIG. 1 have a predetermined mode in which a high frequency electric field is more intense in a region remote from the gyrating center around which an electron circulates, than in a region close to that center. Examples of such modes are: the TEll mode for a waveguide having a rectangular cross section, and TE21 mode for a waveguide having a circular cross section.

The interaction occurs in the resonant cavity section 13 between the gyrating electron and the electromagnetic waves of a specified mode. This electron-wave interaction imparts part of the kinetic energy of the electron to the electromagnetic wave. Electromagnetic waves of specific strength and mode are thereby oscillated. The electromagnetic waves thus oscillated propagate and the electron beam travels from the resonance cavity 13 into the waveguide 14. In the waveguide 14, the waves interact with the electron beam and are intensified or amplified.

The peniotron, which operates as has been described, can convert the kinetic energy of the electrons to the energy of electromagnetic waves with a high efficiency. It will be explained how the peniotron achieves a high energy-conversion efficiency.

Figure 2:
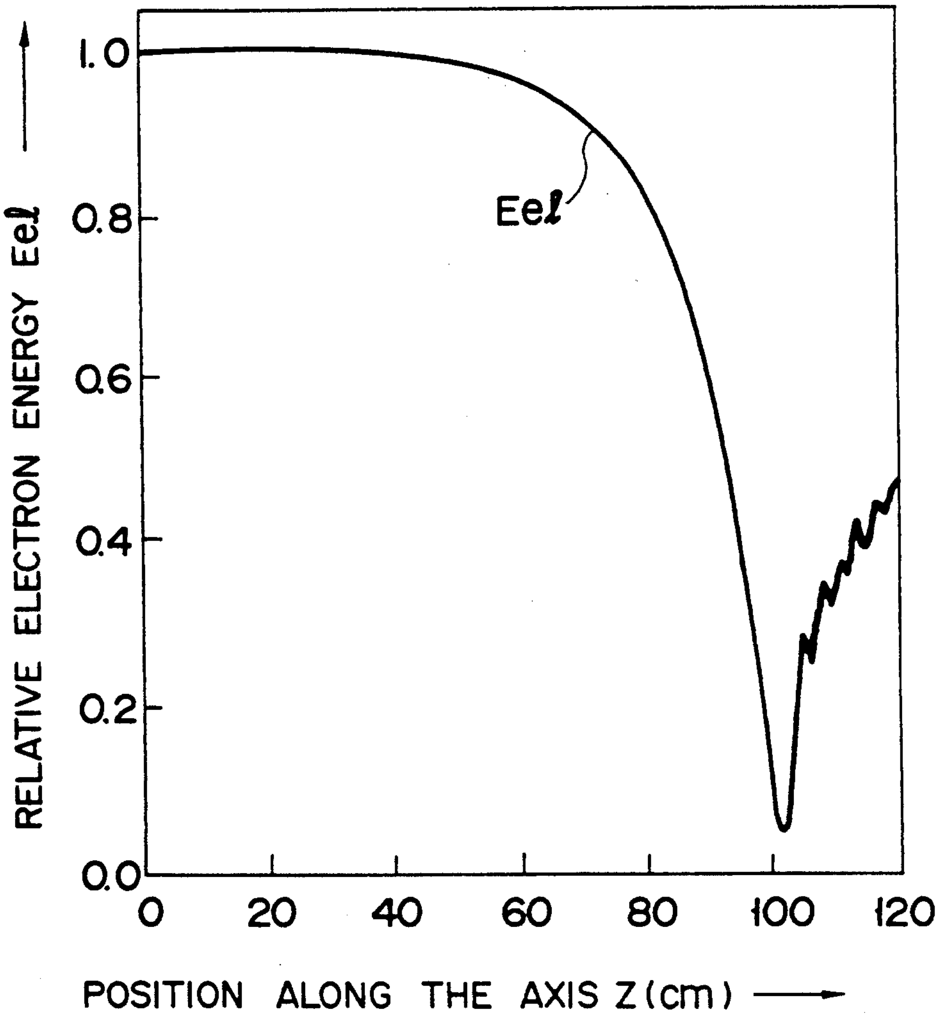
FIG. 2 is a graph explaining how the kinetic energy of electrons changes as the electrons travel within the propagating waveguide shown in FIG. 1, in the axial direction of the oscillator.

As has been pointed out, the kinetic energy of the electron beam is converted into that of electromagnetic waves in two steps. First, part of the kinetic energy is imparted to the electromagnetic waves within the resonant cavity section 13. Then, the rest of the energy is imparted to the electromagnetic waves within the propagating waveguide 14 connected to the downstream end of the resonant cavity section 13. FIG. 2 shows the relationship between the kinetic energy Eel of the electron beam and the position within the waveguide 14, the relationship having been determined by computer simulation wherein the mode TE21 was selected for the waveguide 14 and auto-resonant conditions were set. FIG. 2 illustrates how the average kinetic energy of 24 sample electrons having different incidence phases in respect to the TE mode changes as they travel through the waveguide 14 along the axis z thereof, toward the output end of the waveguide 14. As the curve shown in FIG. 2 indicates, all gyrating electrons forming the beam impart their respective energies to the electromagnetic waves and then lose energy—substantially at the same time, as if a single electron gave great energy to the electromagnetic waves and lost its energy. As is evident from FIG. 2, the peniotron achieved a maximum energy-conversion efficiency of 95%. As the results of the computer simulation suggest, the peniotron shown in FIG. 1 can convert the kinetic energy of an electron beam to that of electromagnetic waves with an efficiency which is nearly equal to 100%, if the peniotron is maintained under an optimum operation condition.

This high energy-conversion efficiency could not be attained if all kinetic energy of the electron beam were converted into high frequency energy corresponding to the whole output power of the peniotron, in the cavity section 13 only. The inventors hereof conducted a computer simulation to determine the efficiency at which all kinetic energy of the beam could be converted to high frequency energy in the resonance cavity section 13 only. The results of this simulation was a conversion efficiency of 67% at most. This is because no auto-resonant conditions can be set within the cavity section 13. More precisely, this is because, as the electrons interact with the electromagnetic waves in only the resonant cavity section 13, their kinetic energies are non-uniformly decreased by the reflection waves generated in the cavity section 13 so that the kinetic energies of the electrons cannot be uniformly converted into the electromagnetic wave. Thus, it is confirmed by the inventors that the non-uniformity of the kinetic energies is produced after almost all of the kinetic energy has been converted into the electromagnetic energy and the electrons have decreased kinetic energies.

In the oscillator shown in FIG. 1, the electromagnetic wave is oscillated in the cavity at low power and the remaining kinetic energies are almost all converted into the electromagnetic wave in the waveguide section 14. Accordingly, it is possible that the oscillator has a high energy-conversion efficiency, as shown in FIG. 2.

Figure 3:
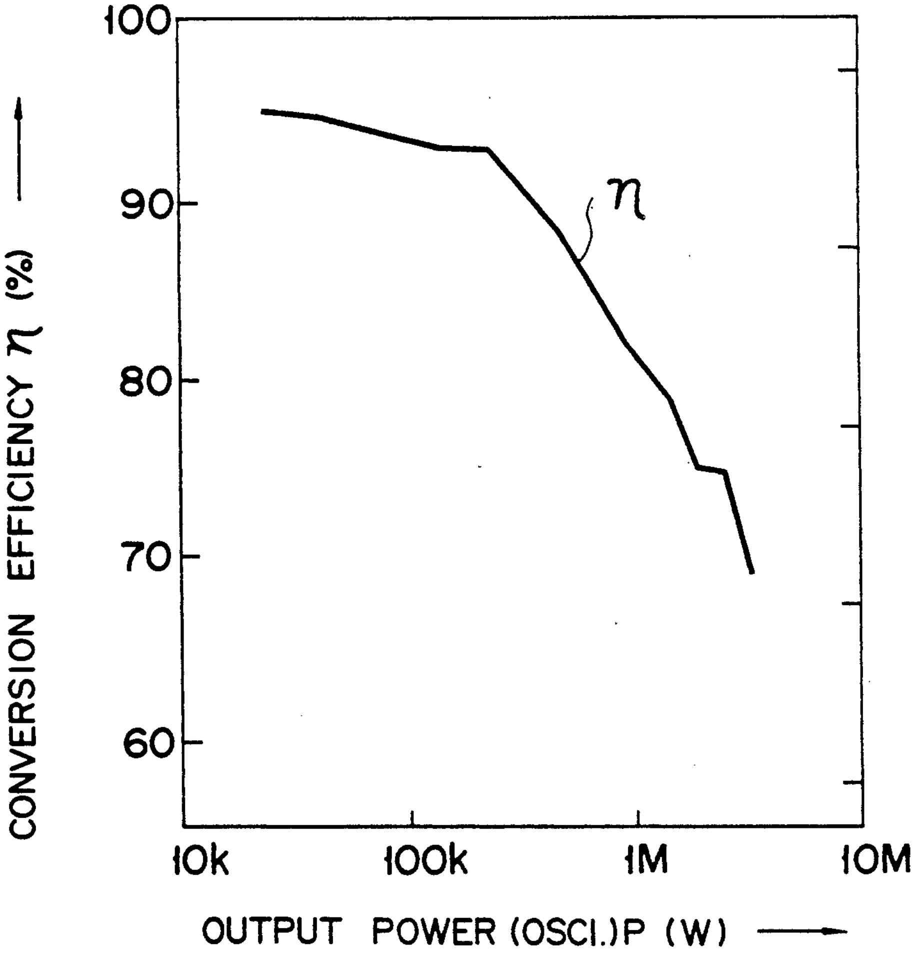
FIG. 3 is a graph representing the relationship between the oscillating power in the resonant cavity of the peniotron and the energy-conversion efficiency of the peniotron.

FIG. 3 is a graph representing the relationship between the energy-conversion efficiency $\eta$ and the power oscillated in the resonance cavity section 13, the relationship being the result of the computer simulation. In this simulation, the target high frequency power was set at about 6.4 MW. As can be understood from FIG. 3, the energy-conversion efficiency can be maintained over 90% when 8% or less, or preferably 4% or less (needless to say, not 0%), of the target output power is oscillated within the resonance cavity section 13.

Apart from the high energy-conversion efficiency, the peniotron shown in FIG. 1 has other advantages. First, it can have a greater tube-diameter than the prior-art peniotron, since the electron interacts with the electromagnetic waves under the auto-resonant conditions in the high frequency circuit assembly, the assembly comprising the resonance cavity section 13 and the propagating waveguide 14. Secondly, it needs only a DC magnetic field which is far less intense than is required in the prior-art peniotron to oscillate electromagnetic waves at the same frequency, from a highpower electron beam. Therefore, the peniotron can oscillate electromagnetic waves, even at wavelengths in the sub-millimeter order, with high efficiency.

Figure 4:
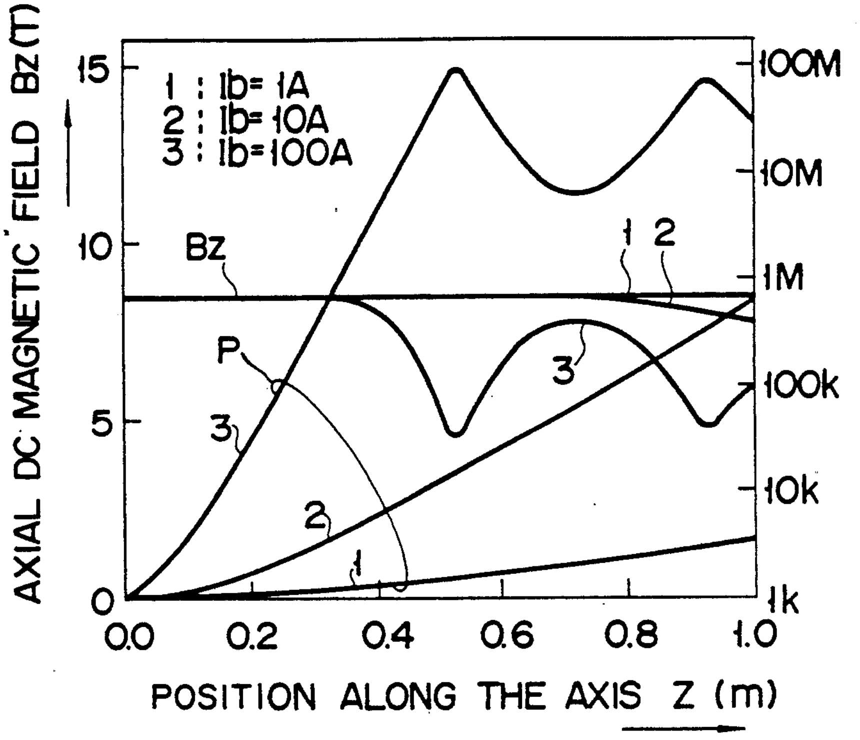
FIGS. 4, 5, and 6 are also graphs showing the operating characteristic of another peniotron according to the present invention.
Figure 5:
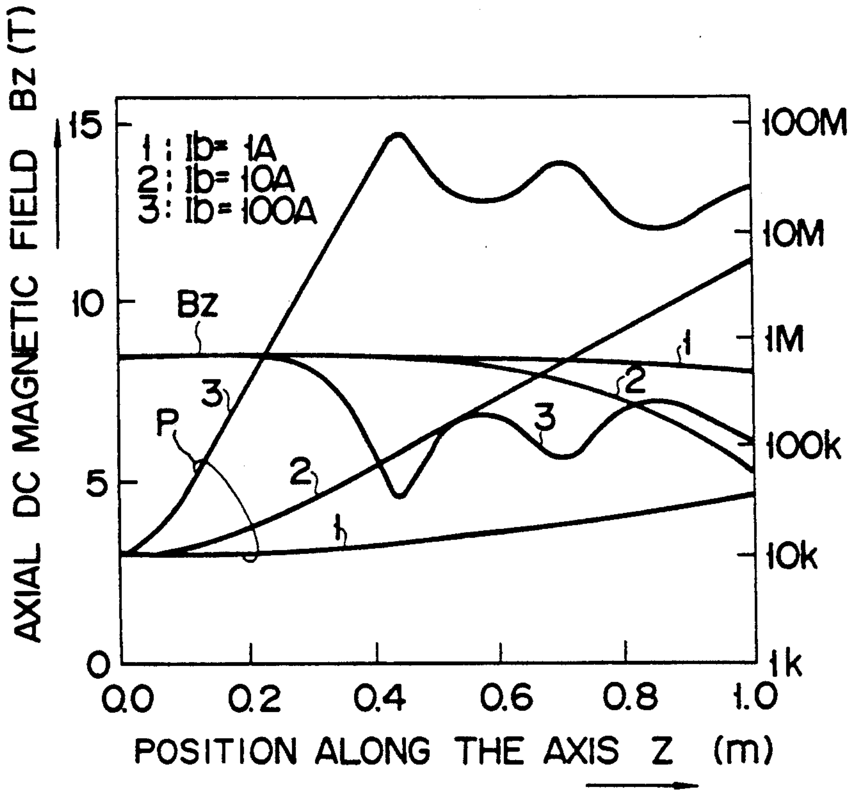
Figure 6:
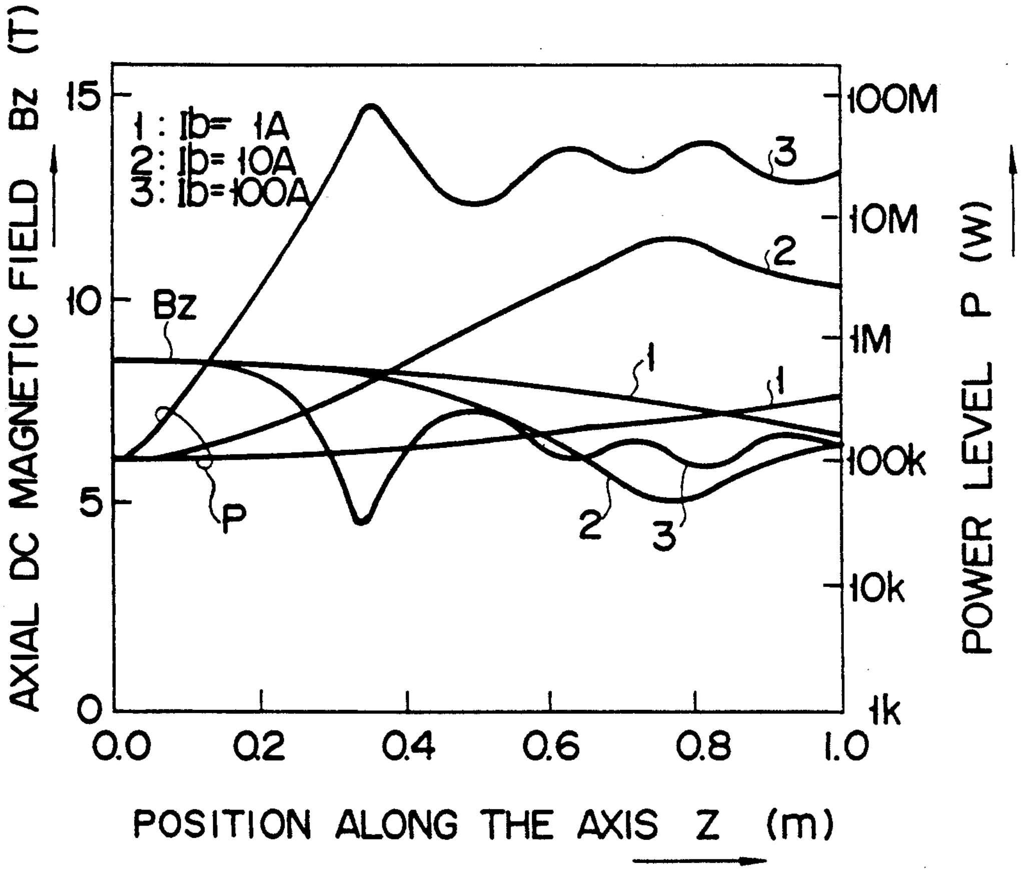

The present invention is not limited to the embodiment illustrated in FIG. 1. For instance, the solenoid coil unit 20 can be replaced by a plurality of solenoid units which are arranged along the axis z of the peniotron. In this case, the coil units generate magnetic fields whose intensities differ such that these magnetic fields form a DC magnetic field extending along the axis z and having a tapered intensity distribution Bz at the downstream side of the waveguide 14 as shown in FIGS. 4, 5 and 6. In the actual waveguide, it is confirmed that the phase velocity Vp of the electromagnetic wave is greater than the light velocity c. Thus, in the conventional peniotron, the ideal autoresonant conditions cannot be obtained. However, the auto-resonant condition can be obtained if the DC magnetic field has the tapered intensity distribution according to the embodiment of the invention. Accordingly, this embodiment can also attain a sufficiently high energy-conversion efficiency, as will be understood from FIGS. 4, 5 and 6 which represent the results of the simulation conducted by the inventors.

In the simulation, the phase velocity Vp was set at 1.05 times the light velocity c, the TE21 mode was selected, and the oscillation frequency and the acceleration voltage were set at 200 GHz and 1 MV, respectively. Further, the ratio of the velocity at which the electrons are circulated, to the velocity at which they move along the axis z was selected to be 1.109, and the intensity of the magnetic field in the upstream end of the waveguide and the inner diameter of the waveguide were set at 8.41 Tesla and 2.39 mm, respectively.

FIG. 4 illustrates how the high frequency power P and the DC magnetic field Bz are distributed in the waveguide 14 when the high frequency power supplied to the waveguide 14 from the cavity 13 is 1 kW. Similarly, FIG. 5 shows how the power P and the magnetic field B are distributed in the waveguide 14 when the high frequency power supplied to the waveguide 14 from the cavity 13 is 10 kW. FIG. 6 represents how the power P and the magnetic field are distributed in the waveguide 14 when the high frequency power supplied to the waveguide 14 from the cavity 13 is 100 kW. More specifically, in each of these FIGURES, intensity curves 1, 2, and 3 indicate the intensity distribution of the DC magnetic field Bz which are set when the electron-beam current is 1 A, 10 A, and is 100 A, respectively. Further, in each of FIGS. 4, 5, and 6, power curves 1, 2, and 3 represent the distributions of the high frequency power P which are calculated from the intensity distributions when the electron-beam current is 1 A, 10 A, and is 100 A, respectively.

As can be seen from FIGS. 4, 5, and 6, the high frequency power P increases as the electron beam travels toward downstream-end of the waveguide. This is because the DC magnetic field is maintained at substantially constant level in the upstream portion of the waveguide 14 and gradually decreased in the downstream portion of the waveguide 14. The magnetic field is held almost at substantially constant level in the upstream portion of the waveguide in which the electron beam interacts within the electromagnetic waves to a low degree. By contrast, the magnetic field is decreased gradually in the downstream portion in which the interaction between the beam and the electromagnetic waves is increased and the auto-resonant conditions which are changed due to the changes of the electron mass and the velocity of the electrons, are corrected by the tapered distribution 1, 2 or 3 of the curve Bz. Hence, the peniotron according to the second embodiment can also attain a high energy-conversion efficiency and output a high frequency power.

As has been explained, the peniotron according to invention comprises a high frequency circuit assembly having a resonant cavity section and a propagating waveguide connected to the downstream end of the resonance cavity section. In the circuit assembly, electrons gyrate, and electromagnetic waves are oscillated and amplified The electrons and the waves interact, while satisfying conditions required for auto-resonance. More specifically, the electron beam interacts with the electromagnetic waves to a low degree in the cavity and the upstream portion of the waveguide, generating a high frequency power of a value far less than the target value, and then interacts with the waves to a sufficient degree in the downstream portion of the waveguide, thereby generating a high frequency power of the target value. It is possible that both the resonant cavity section and the propagating waveguide have inner diameters greater than those of their counterpart incorporated in the conventional peniotron. Due to the two-step interaction between the electron beam and the electromagnetic waves, and also the use of the resonant cavity section and the waveguide, both having a large inner diameter, the peniotron according to the invention can convert an electron beam into high frequency high power with high energy-conversion efficiency.

What is claimed is:

1. An extremely high frequency oscillator comprising:

beam-generating means for generating a beam of electrons and directing the electrons in a predetermined direction;

means for applying a DC magnetic field to the electrons generated by said beam-generating means, thereby causing each of the electrons to gyrate along the predetermined direction;

energy-converting means for causing the electrons to interact with an electromagnetic wave of TE mode, thereby to convert kinetic energy of the gyrating electrons into energy of the electromagnetic wave, said energy-converting means including a resonant cavity section and a propagating waveguide section connected to the resonant cavity section, auto-resonant conditions being preserved in the resonant cavity and propagating waveguide sections, the electromagnetic-wave being oscillated in said resonant cavity section and amplified in the propagating waveguide section, the electromagnetic wave in the resonant cavity section having a power level which is less than an output power of the electromagnetic wave from said propagating waveguide section; and electro-collecting means for collecting the electrons from the propagating waveguide section.

2. The extremely high frequency oscillator according to claim 1, wherein the power level of the electromagnetic-wave oscillated in said resonant cavity section is 8% or less (but not 0%) of the electromagnetic-wave output power from said propagating waveguide section.

3. The extremely high frequency oscillator according to claim 1, wherein the DC magnetic field extends through said propagating waveguide section and becomes less intense gradually toward the output end thereof at the downstream side of the electron beam.

4. The extremely high frequency oscillator according to claim 1, wherein said beam-generating means generates a hollow electron beam.

* * * * *